United States Patent
Bolde et al.

(10) Patent No.: US 6,888,363 B1
(45) Date of Patent: May 3, 2005

(54) METHOD AND DEVICE FOR COOLING/HEATING DIE DURING BURN IN

(75) Inventors: Lannie R. Bolde, New Paltz, NY (US); David C. Olson, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/710,223

(22) Filed: Jun. 28, 2004

(51) Int. Cl.[7] .............................................. G01R 31/26
(52) U.S. Cl. ...................................... 324/760; 324/765
(58) Field of Search ................................ 324/760–765, 324/158.1, 73.1; 165/80.4–80.5; 219/513, 209; 438/14–18, 660, 715

(56) References Cited

U.S. PATENT DOCUMENTS

| | | | | |
|---|---|---|---|---|
| 4,426,619 A | * | 1/1984 | Demand | 324/760 |
| 4,607,220 A | * | 8/1986 | Hollman | 324/760 |
| 4,954,774 A | * | 9/1990 | Binet | 324/760 |
| 6,184,504 B1 | * | 2/2001 | Cardella | 219/513 |
| 6,191,599 B1 | * | 2/2001 | Stevens | 324/760 |

* cited by examiner

*Primary Examiner*—Vinh P. Nguyen
(74) *Attorney, Agent, or Firm*—Jay H. Anderson

(57) ABSTRACT

A system for burn-in testing of integrated circuits employs a cooling module with an aperture that accommodates a standard size holder for various chips, the holder being placed in the mouth of the aperture, in contact with a flexible seal. When the module is raised to make contact from below with a socket on a test board, the seal confines the cooling fluid and contacts on the upper surface of the holder are pressed against a set of corresponding contacts on the test board.

20 Claims, 2 Drawing Sheets

METHOD AND DEVICE FOR COOLING/ HEATING DIE DURING BURN IN

BACKGROUND OF INVENTION

The field of the invention is burn-in testing of integrated circuits. In particular, the invention relates to apparatus for placing a test chip in a test fixture and cooling the chip during the test.

Standard procedure in the integrated circuit industry has been to conduct a test called a burn-in test, in which a circuit is operated at an elevated temperature and/or voltage for a period of time, while being tested for proper operation.

Operation at an elevated temperature and/or voltage stresses the circuit through the differential thermal expansion of various components and also accelerates various failure mechanisms in the transistors and interconnects that combine to make up the integrated circuit.

For example, an integrated circuit will have many thousands or millions of joints where dissimilar conductors meet. Heating and cooling cycles will put stress on these joints. The failure of any one joint through separation of the two components may cause the circuit to fail.

As technology has evolved, the operating temperatures and heat dissipation of circuits have increased. At the same time, competition has exerted pressure on manufacturers to reduce costs. Expensive methods of temperature control such as are employed in mainframe computers are not commercially practical in the field of consumer electronics or other price-sensitive markets.

Driven by industry demands to produce computer die with increasingly dense circuitry on larger die dimensions, a need for advanced means to cool the chip during the burn in operation has been revealed.

Present methods of transferring heat to and from the chip are done by means of direct contact with a chilled copper block. This method is limited by the contact area between the die and block. For the best results, it is desirable to make 100% contact between die surface and the chilled block, however, matching the surface profiles between the chilled block and die to make this a reality is not possible. There will therefore be variation in the amount of contact between one chip and another and therefore variation in thermal resistance resulting in variation of test temperature between one chip and another.

Potential damage to the die interconnect joints, test sockets and boards exist with current methods and devices used in placing and holding the block against the chip.

FIG. 3 illustrates a typical test apparatus used at present.

At the bottom of the Figure, a test table 10 supports the structure. The test system rests on table 10 on legs 22 that support board holder 20. Board holder 20 holds printed circuit board 110, which may be a production board or a special test board that holds one or more chips being tested.

Socket 115 provides a defined location for the chip and electrical contacts in conventional connections.

Substrate 117 holds the chip being tested, denoted with numeral 120, and provides a standard interface with the test board.

Electrical power and a test pattern of signals will be delivered to chip 120 through connections in substrate 117 and test board 110.

Cooling of the chip during the test is provided by a unit denoted generally by numeral 210 and having an electrical heater 220 and cooling fluid entering on flexible tube 232 and exiting on tube 234. These tubes typically carry cooling water and must be insulated from contact with the chip or with the voltage on the heating wire. An electrical ground connection 222 is provided to ensure that electrical leakage does not bias the chip itself, which is conventionally designed to operate with its outer surface at ground.

At the top of the figure, block 240 denotes a transfer mechanism, typically a hydraulic cylinder with a piston, that forces the bottom surface of heatsink 210 against the top surface of chip 120.

There is the problem of incomplete contact that will vary from chip to chip and therefore produce different operating temperatures during the test.

In addition, the application of force to improve contact carries the danger of damage to the chip.

SUMMARY OF INVENTION

The invention relates to apparatus for conducting burn-in tests with control over temperature during the test.

A feature of the invention is a cooling mechanism that employs a non-conductive fluid in direct contact with the chip being tested.

Another feature of the invention is insertion of the chip in a test circuit board from below.

DETAILED DESCRIPTION

Figure 1:
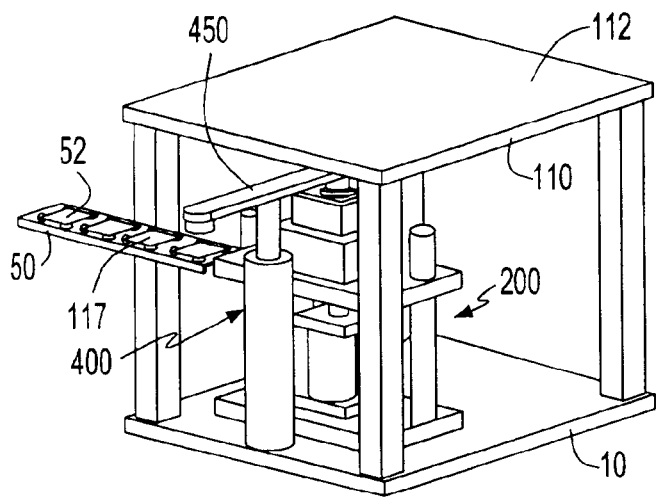
FIG. 1 shows a perspective view of an apparatus according to the invention.

FIG. 1 shows an overall perspective view of an apparatus according to the invention, in which a set of chip holders 117 (also referred to as substrates) on a carrier 50 on the left front of the Figure are presented to a material handling system (referred to as a pick and place system) denoted generally by the numeral 400. The handling system transfers a holder to a location system 200 that raises it to engage contacts on the lower side of test board 110.

Optionally, a board stiffener 112 supplies mechanical strength to support board 110 to resist deflection from the upward force supplied by the location system 200.

Carrier 50 contains a number of substrate locations 52 that hold a substrate 117 that interfaces with the chips being tested.

Arm 450 of the pick and place system 400 sequentially picks up the next substrate and chip and places it in the locating apparatus that places the substrate into a socket on a test board 110 similar to that used in the prior art. At the end of the test, the pick and place system removes the tested chip and proceeds to the next one. The material handling system is shown in partially pictorial and partially schematic fashion. Those skilled in the art will appreciate that various types of commercially available handling systems may used in systems according to the invention.

Figure 2A:
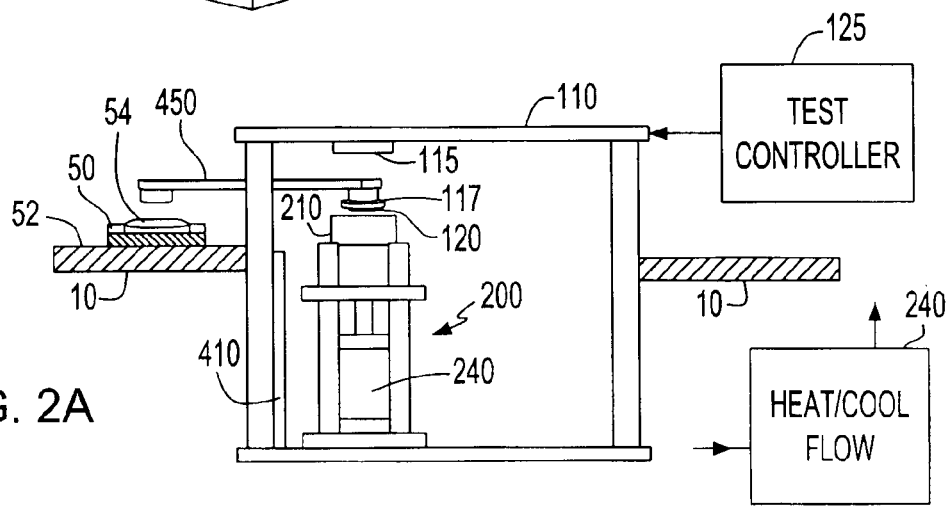
FIG. 2A shows a side view of the apparatus of FIG. 1.

FIG. 2A shows a side view of the apparatus. Location system 200 is shown receiving a substrate 117 having a chip 120 projecting from its lower side. As will be discussed below, the arrangement with the test chip being positioned on the underside of the test board has advantages.

After arm 450 is removed, system 200 will raise the substrate 117 up until the pins 118 (shown in FIG. 2B) on the top surface engage with corresponding sockets on the test board.

Illustratively, one of the functions of the substrate 117 is to present a standard holder contact arrangement to the test board, with internal interconnect wiring not shown being arranged to accommodate various pin-outs on the different chips being tested. In that case, there will be different models of holder 117 with an integrated circuit contact pattern adapted to engage different integrated circuit contacts and a standard pattern of pins or other contacts 118 to engage the test board.

Pins 118 on the substrate 117 engage the test socket 115 from below.

Figure 2B:
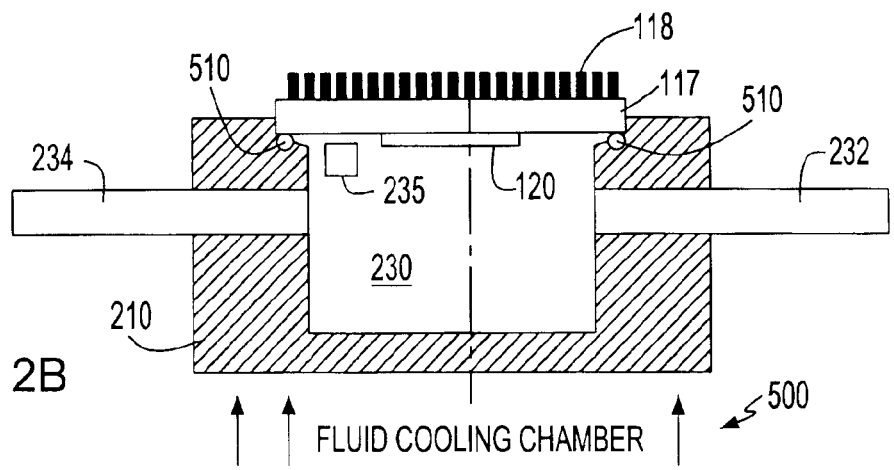
FIG. 2B shows a detail of FIG. 2A.
Figure 3:
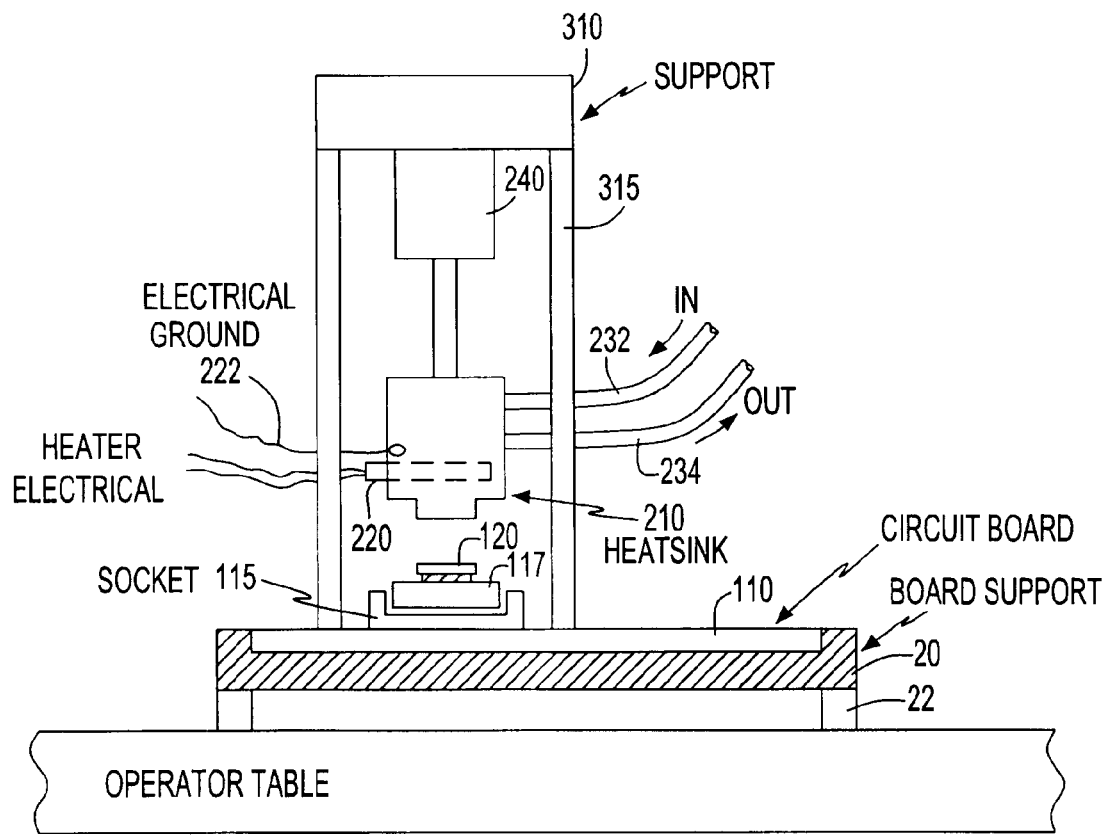
FIG. 3 shows a view of a prior art apparatus.

Referring now to FIG. 2B, there is shown in cross section a detail of FIG. 2A. At the top, a substrate 117 has pins 118 projecting upward as it rests on flexible seal 510. Seal 510 is located on a shelf in chamber 210. Optionally, the seal could be on the lower surface of substrate 117 and rest against the flat shelf in chamber 210. Preferably, the individual receiving contacts in socket 115 on the test board 110 are designed according to the zero insertion force principle, in order to reduce the force needed to be applied to the IC holder to make proper electrical contact.

Another method and common practice for contacting I/O pads is to have commercially available pogo pins or spring probes embedded into the test socket in an array that corresponds to the land grid array of the substrate. In this case, pins 118 would not be attached or needed on the substrate.

Pogo pins are used in current applications and would be the preferred method with this invention.

The system 200 raises up the temperature control module denoted generally with the numeral 500 that contains the fluid reservoir 210 that has an aperture 230 at the top that receives the substrate 117 and supports the flexible seal that confines the cooling fluid.

After the system 200 has raised the temperature control module 500 into position, it continues to apply force upward in order to maintain pressure on seals 510 that combine with substrate 117 to close the top of reservoir 230 and contain the non-conductive cooling fluid. In operation, the fluid enters in line 232 and exits in line 234, surrounding chip 120. Temperature sensors 235 within substrate 117 or immersed within the fluid within substrate 117 will detect the temperature of the coolant near the chip 120. That information is sent to a control system 240 that executes an algorithm to cool or heat the fluid as required to maintain the temperature of chip 120 within a specified range.

The test program is then executed under control of controller 125, at the end of which, the substrate is ejected from board 110 by conventional mechanical means such as a pin pressing on the surface opposite the chip.

The fluid is drained from the aperture and the pick and place system removes the substrate and places the next one on module 500. The fluid need not be drained entirely from the system, so long as the pressure is reduced so that the fluid does not leak out while the seal is broken.

The sequence of operations is:

Insert a set of chips into corresponding substrates 117 and place them chip-down in holder 50; Repeat for the number of test chips:
1) Pick up the nth substrate and place it in the top of aperture 230 of module 500;
2) Raise module 500 to engage the pins on the upper surface of substrate 117 with the test board 110; In the case with product not having pins 118, the substrate I/O pads will contact spring probes embedded within the test socket.
3) Apply upward pressure to module 500 to seal the fluid aperture;
4) Fill the fluid aperture 230 with fluid and bring the chip to the desired temperature;
5) Execute the test program;
6) Drain the cooling fluid;
7) Eject the substrate from the test board;
8) Retract the cooling module;
Go to Step 1 and repeat.

It is an advantageous feature of the invention that the test board 110 is maintained upside down; i.e. with the socket on the bottom surface. It does not matter if other electronics that may be part of the test system are placed on the upper surface of board 110. Leaks from the coolant fluid will not puddle up on the board surface, possibly damaging the electronics. Debris, e.g. from the substrate such as capacitors will not become lodged between the board and the upward-moving cooling module.

The material handling system 400 may maintain the substrates in the orientation in which they are presented, as shown in FIG. 2A, or it may invert them. For example, the substrates may be presented on carrier 50 with the chips up, then rotated 180 degrees to be placed on the cooling module 500 as shown in FIG. 2B.

The mechanism that lifts the cooling module into position may be hydraulic or may be operated by an electric motor, as is convenient.

While the invention has been described in terms of a single preferred embodiment, those skilled in the art will recognize that the invention can be practiced in various versions within the spirit and scope of the following

What is claimed is:

1. A system for presenting integrated circuits to a test board comprising:
   a movable cooling module having a cooling aperture on a first side thereof adapted to receive an integrated circuit holder for holding an integrated circuit to be tested, said integrated circuit holder being adapted to hold an integrated circuit within said cooling aperture, said integrated circuit holder having a set of holder contacts on a second side opposite said first side;
   coolant circulation means for circulating coolant within said cooling aperture in said cooling module; and
   location means for moving said cooling module vertically to a position in which said holder contacts engage corresponding board contacts on a lower side of a test board, wherein
   said integrated circuit holder is adapted to fit within said cooling aperture on a top surface of said cooling module and to interface with a seal to close said aperture;
   said corresponding board contacts are disposed on a lower side of said test board; and
   said location means raises said cooling module toward said test board to engage said holder contacts with said corresponding board contacts.

2. A system according to claim 1, in which said cooling aperture has a flexible seal on a surface facing said integrated circuit holder, whereby said seal confines said cooling fluid within said cooling aperture.

3. A system according to claim 2, in which said location means applies vertical pressure on said cooling module to maintain the effectiveness of said seal during test operation.

4. A system according to claim 3, further comprising means for maintaining the temperature of said integrated circuit at a test temperature value.

5. A system according to claim 3, in which said integrated circuit holder contacts have a standard pattern adapted to engage said board contacts and said integrated circuit holder has integrated circuit contacts adapted to engage the contact pattern of an integrated circuit; and said substrate holder has a set of interconnections to connect said integrated circuit contacts with said holder contacts.

6. A system according to claim 2, further comprising means for maintaining the temperature of said integrated circuit at a test temperature value.

7. A system according to claim 6, in which said integrated circuit holder contacts have a standard pattern adapted to engage said board contacts and said integrated circuit holder has integrated circuit contacts adapted to engage the contact pattern of an integrated circuit; and said substrate holder has a set of interconnections to connect said integrated circuit contacts with said holder contacts.

8. A system according to claim 2, in which said integrated circuit holder contacts have a standard pattern adapted to engage said board contacts and said integrated circuit holder has integrated circuit contacts adapted to engage the contact pattern of an integrated circuit; and said substrate holder has a set of interconnections to connect said integrated circuit contacts with said holder contacts.

9. A system according to claim 1, in which said integrated circuit holder has a flexible seal on a surface facing said cooling aperture, whereby said seal confines said cooling fluid within said cooling aperture.

10. A system according to claim 9, in which said location means applies vertical pressure on said cooling module to maintain the effectiveness of said seal during test operation.

11. A system according to claim 1, further comprising means for maintaining the temperature of said integrated circuit at a test temperature value.

12. A system according to claim 11, in which said integrated circuit holder contacts have a standard pattern adapted to engage said board contacts and said integrated circuit holder has integrated circuit contacts adapted to engage the contact pattern of an integrated circuit; and said substrate holder has a set of interconnections to connect said integrated circuit contacts with said holder contacts.

13. A system according to claim 1, in which said integrated circuit holder contacts have a standard pattern adapted to engage said board contacts and said integrated circuit holder has integrated circuit contacts adapted to engage the contact pattern of an integrated circuit; and said substrate holder has a set of interconnections to connect said integrated circuit contacts with said holder contacts.

14. A method of testing an integrated circuit, comprising the steps of:

providing a set of integrated circuit chips placed in corresponding holders disposed in a carrier, said holders having a set of holder contacts on an upper surface thereof adapted to engage corresponding board contacts on the lower surface of a test board; and repeating for each of the chips:

a) place an nth holder containing an nth chip in the top of a cooling aperture of a cooling module;

b) raise said cooling module from a receiving position to engage said holder contacts on the upper surface of said holder with said corresponding board contacts;

c) fill said cooling aperture with cooling fluid and bring said chip to a desired temperature;

d) Execute a test program to test said nth chip;

e) Drain said cooling fluid;

f) Retract the cooling module;

g) Remove said holder containing said nth chip.

15. A method according to claim 14, further comprising a step of applying upward pressure on said cooling module during the execution of said test program to confine said cooling fluid.

16. A method according to claim 15, in which said step of applying upward pressure is carried out by maintaining said cooling module in a test position that compresses a compressive seal between said cooling module and said integrated circuit holder.

17. A method according to claim 14, in which said cooling aperture has a flexible seal on a surface facing said integrated circuit holder, whereby said seal confines said cooling fluid within said cooling aperture.

18. A method according to claim 14, in which said integrated circuit holder has a flexible seal on a surface facing said cooling aperture, whereby said seal confines said cooling fluid within said cooling aperture.

19. A method according to claim 17, further comprising a step of maintaining said desired temperature during said test program.

20. A method according to claim 18, further comprising a step of maintaining said desired temperature during said test program.

* * * * *